(12) United States Patent
Fang et al.

(10) Patent No.: US 10,892,306 B1
(45) Date of Patent: Jan. 12, 2021

(54) DISPLAY PANEL AND DISPLAY DEVICE

(71) Applicant: Shanghai Tianma AM-OLED Co., Ltd., Shanghai (CN)

(72) Inventors: Yueting Fang, Shanghai (CN); Lijing Han, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 0 days.

(21) Appl. No.: 16/681,962

(22) Filed: Nov. 13, 2019

(30) Foreign Application Priority Data

Jun. 28, 2019 (CN) .......................... 2019 1 0579243

(51) Int. Cl.
*H01L 27/32* (2006.01)
*G06F 3/044* (2006.01)

(52) U.S. Cl.
CPC .......... *H01L 27/323* (2013.01); *G06F 3/0446* (2019.05); *H01L 27/3246* (2013.01); *G06F 2203/04111* (2013.01)

(58) Field of Classification Search
CPC ............... H01L 27/323; H01L 27/3246; H01L 27/3276; G06F 3/0446; G06F 3/044; G06F 2203/04103
See application file for complete search history.

(56) References Cited

U.S. PATENT DOCUMENTS

| 10,199,440 | B2* | 2/2019 | Park | G06F 3/044 |
| 2016/0149164 | A1* | 5/2016 | Lee | H01L 51/56 |
| | | | | 257/40 |
| 2017/0024075 | A1* | 1/2017 | Chiang | H01L 27/3246 |
| 2017/0185203 | A1* | 6/2017 | Seong | G06F 3/044 |
| 2017/0205959 | A1* | 7/2017 | Seong | H01L 51/5271 |
| 2019/0073071 | A1* | 3/2019 | Ryu | H01L 51/525 |
| 2019/0319076 | A1* | 10/2019 | Lee | H01L 27/3246 |

FOREIGN PATENT DOCUMENTS

| CN | 107203296 A | 9/2017 |
| CN | 108493219 A | 9/2018 |

* cited by examiner

*Primary Examiner* — Sardis F Azongha
(74) *Attorney, Agent, or Firm* — Christensen O'Connor Johnson Kindness PLLC

(57) ABSTRACT

A display panel includes a pixel defining layer, light-emitting unit, first support post, and touch layer. The light-emitting unit includes first electrode, light-emitting layer, and second electrode. The first support post is located between the pixel defining layer and the first electrode in direction perpendicular to display panel, and is located in non-aperture region of the pixel defining layer. The first electrode covers the light-emitting layer and the first support post. The touch layer is located at a side of the first electrode away from the pixel defining layer, and includes hollow portion, first portion and second portion that are mutually connected. In direction perpendicular to the display panel, both first portion and hollow portion overlap first support post, second portion does not overlap first support post. Overlapping portion of first portion and first supporting post has smaller area than first supporting post. A display device is also provided.

18 Claims, 11 Drawing Sheets

US 10,892,306 B1

DISPLAY PANEL AND DISPLAY DEVICE

CROSS-REFERENCE TO RELATED APPLICATIONS

The present application claims priority under 35 U.S.C. § 119 to Chinese Patent Application No. 201910579243.8, filed on Jun. 28, 2019, the content of which is incorporated herein by reference in its entirety.

TECHNICAL FIELD

The present disclosure relates to the field of display technologies, and more particularly, to a display panel and a display device.

BACKGROUND

With the rapid development of display technology and human-computer interaction technology, display panels having touch functions have been more and more widely used. A capacitive touch display panel determines an occurrence of a touch by detecting an amount of a change in a capacitance of a touch electrode before and after the touch is performed. However, in a built-in touch display panel, a parasitic capacitance may be generated between a touch layer and existing metal wirings in the display panel, which may easily affect touch precision of the display panel.

SUMMARY

In view of this, an embodiment of the present disclosure provides a display panel, for improving a touch performance of the display panel under the premise of reducing a parasitic capacitance between a touch layer and a first electrode.

In one aspect, an embodiment of the present disclosure provides a display panel, including: a pixel defining layer comprising a plurality of aperture regions and a non-aperture region;

a light-emitting unit comprising a first electrode, a light-emitting layer, and a second electrode that are stacked, wherein the light-emitting layer is arranged in the aperture region, the first electrode is located at a side of the light-emitting layer facing away from the pixel defining layer, the second electrode is located at a side of the light-emitting layer close to the pixel defining layer, and the first electrode covers a display region over its entire surface;

a first support post located between the pixel defining layer and the first electrode, wherein an orthographic projection of the first support post on a plane of the display panel is within the non-aperture region, and the first electrode covers the light-emitting layer and the first support post; and a touch layer located at a side of the first electrode facing away from the pixel defining layer, and comprising a hollow portion, a first portion and a second portion connected to the first portion, wherein both the first portion and the hollow portion overlap the first support post in a direction perpendicular to the plane of the display panel, the second portion does not overlap the first support post in the direction perpendicular to the plane of the display panel, and an area of an overlapping portion of the first portion and the first support post in the direction perpendicular to the plane of the display panel is smaller than an area of the first support post in the direction perpendicular to the plane of the display panel.

In another aspect, the present disclosure provides a display device, including the display panel described as above.

BRIEF DESCRIPTION OF DRAWINGS

In order to better illustrate technical solutions of embodiments of the present disclosure, the accompanying drawings used in the embodiments are briefly described below. The drawings described below are part of the representative embodiments of the present disclosure. Other embodiments are expressly contemplated.

DESCRIPTION OF EMBODIMENTS

In order to better understand technical solutions of the present disclosure, the embodiments of the present disclosure are described in detail with reference to the drawings.

It should he clear that the described embodiments are representative embodiments of the present disclosure, rather than all of the embodiments.

The terms used in the embodiments of the present disclosure are for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

It should be understood that the term "and/or" as used herein is an association describing the associated object, indicating that there may be three relationships. For example, A and/or B may indicate three cases: only A exists; A and B exist concurrently; only B exists. In addition, a character "/" herein generally indicates that the contextual objects are in an "or" relationship.

It should be understood that although terms first, second, third, etc. may be used to describe support posts in the embodiments of the present disclosure, these support posts should not he limited to these terms. These terms are used to distinguish the support posts from each other. For example, a first support post may also be referred to as a second support post, and similarly, a second support post may also be referred to as a first support post, without departing from the scope of embodiments of the present disclosure.

Figure 1:
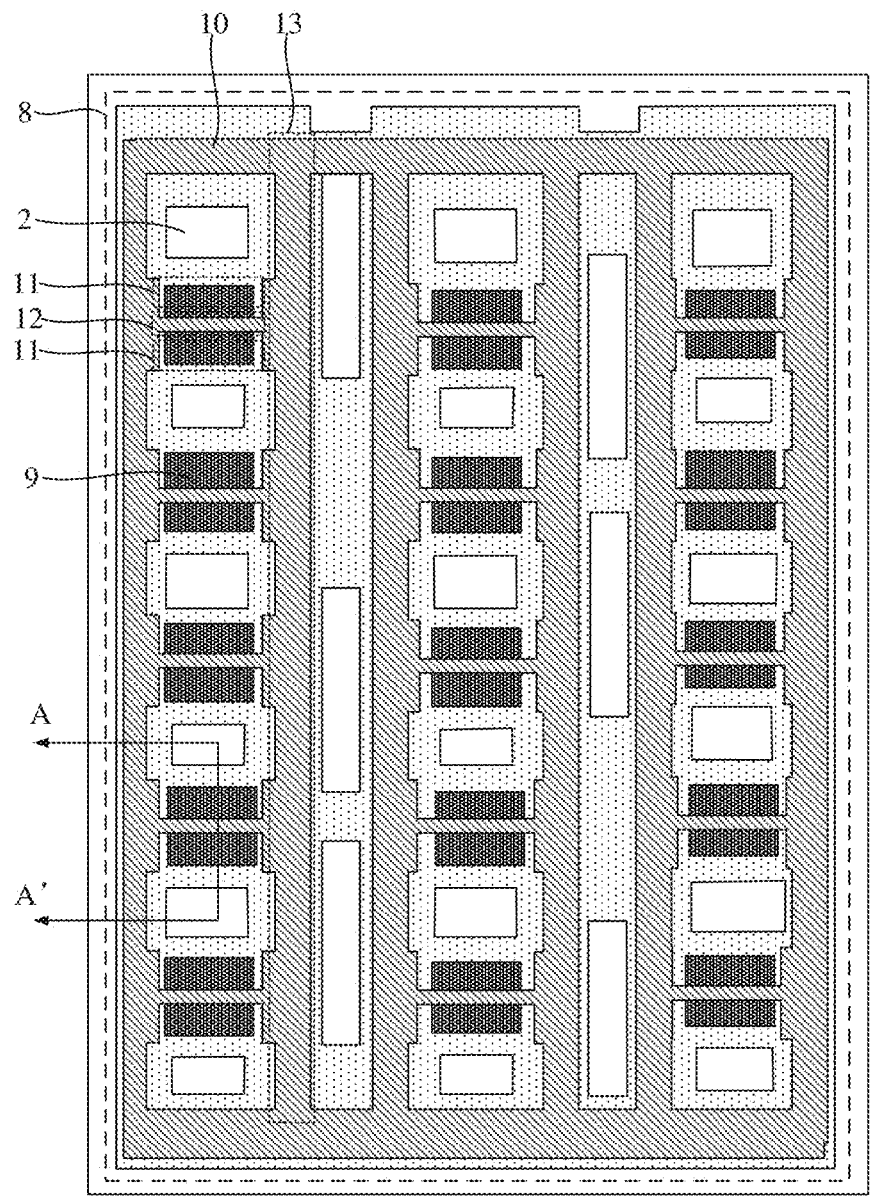
FIG 1 illustrates a top schematic diagram of a display panel according to an embodiment of the present disclosure.
Figure 2:
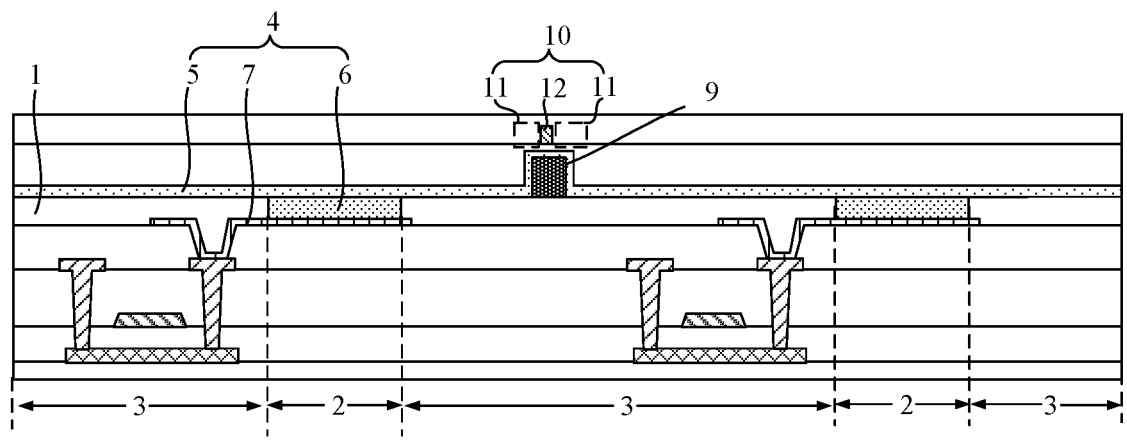
FIG. 2 illustrates a cross-sectional schematic diagram taken along line AA' of FIG. 1.
Figure 4:
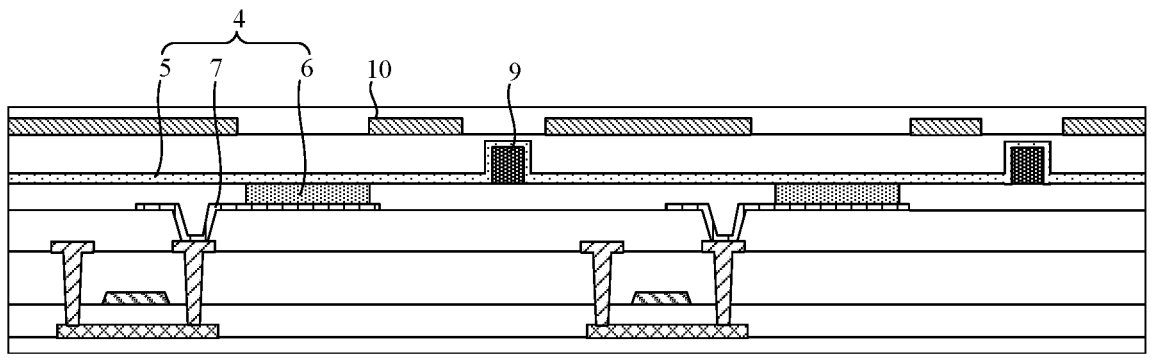
FIG. 4 illustrates a cross-sectional schematic diagram along line AA' of FIG. 3.

An embodiment of the present disclosure provides a display panel, as shown in FIG. 1 and FIG. 4. FIG. 1 illustrates a top schematic diagram of a display panel according to an embodiment of the present disclosure and FIG. 2 illustrates a cross-sectional schematic diagram taken along AA' of FIG. 1. The display panel includes a pixel defining layer 1, a light-emitting unit 4, a first support post 9, and a touch layer 10. The pixel defining layer 1 includes a plurality of aperture regions 2 and a non-aperture region 3. The light-emitting unit 4 includes a first electrode 5, a light-emitting layer 6, and a second electrode 7 which are disposed in a stack manner. The light-emitting layer 6 is located in the aperture region 2 of the pixel defining layer 1. Moreover, the first electrode 5 is located at a side of the light-emitting layer 6 facing away from the pixel defining layer 1, and the second electrode 7 is located at a side of the light-emitting layer 6 close to the pixel defining layer 1. As shown in FIG. 4, the first electrode 5 covers a display region 8 over its entire surface.

The first support post 9 is located between the pixel defining layer 1 and the first electrode 5, and an orthographic projection of the first support post 9 on a plane, in which the display panel is located, is in the non-aperture region 3. Moreover, the first electrode 5 covers the light-emitting layer 6 and the first support post 9.

The touch layer 10 is located at a side of the first electrode 5 facing away from the pixel defining layer 1. The touch layer 10 includes a hollow portion 11, a first portion 12 and a second portion 13 connected to the first portion 12. Orthographic projections of both the first portion 12 and the hollow portion 11 on the plane where the display panel is located overlap the orthographic projection of the first support post 9 on the plane where the display panel is located, that is, in a direction perpendicular to the plane where the display panel is located, the first portion 12 and the hollow portion 11 do not overlap the first support post 9. An orthographic projection of the second portion 13 on the plane where the display panel is located does not overlap the orthographic projection of the first support post 9 on the plane. where the display panel is located, that is, in the direction perpendicular to the plane where the display panel is located, the second portion 13 does not overlap the first support post 9. In addition, an area of an orthographic projection of an overlapping portion of the first portion 12 and the first support post 9 on the plane where the display panel is located is smaller than an area of the orthographic projection of the first support post 9 on the plane where the display panel is located, that is, in the direction perpendicular to the plane where the display panel is located, the area of the overlapping portion of the first portion 12 and the first support post 9 is smaller than the area of the first support post 9.

In the display panel provided by the embodiments of the present disclosure, the touch layer 10 includes a hollow portion 11 and a first portion 12. In one aspect, by providing the hollow portion 11 in a region corresponding to the first support post 9 in the touch layer 10, a problem of a relatively large parasitic capacitance caused by the first electrode 5 covering the first support post 9 being too close to the touch layer 10 can be avoided. In another aspect, the region corresponding to the first support post 9 in the touch layer 10 is not completely hollowed out, which can increase a coverage area of the touch layer 10, thereby improving the touch precision of the display panel.

Figure 3:
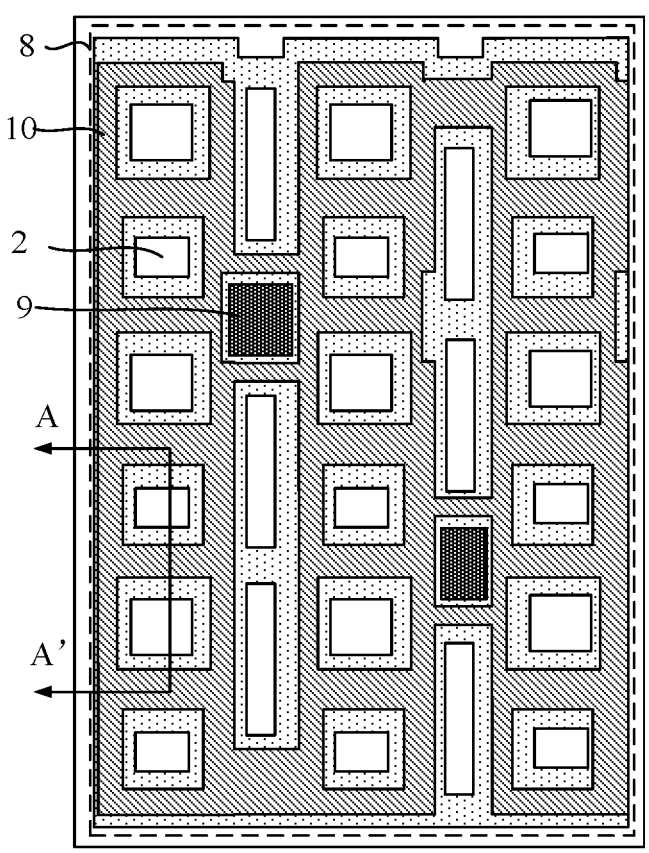
FIG. 3 illustrates a top schematic diagram of a display panel according to an embodiment of the present disclosure.

FIG. 3 illustrates a representative top schematic diagram of a display panel according to an embodiment of the present disclosure and FIG. 4 illustrates a cross-sectional schematic diagram of a display panel according to an embodiment of the present disclosure. In the embodiments of the present disclosure, the portion corresponding to the first support post 9 in the touch layer 10 can be completely hollowed out in order to reduce a directly facing area between the touch layer 10 and the cathode layer 2, thereby reducing the parasitic capacitance between the touch layer 10 and the first electrode 5.

Figure 5:
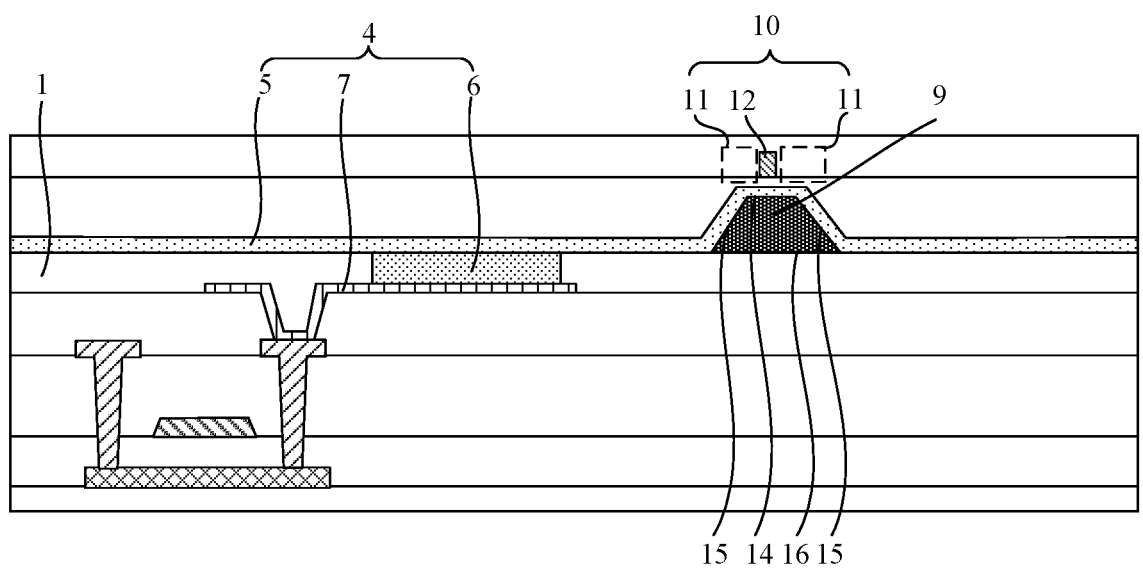
FIG. 5 illustrates another cross-sectional schematic diagram along line AA' of FIG. 1.

FIG. 5 illustrates another representative cross-sectional schematic diagram along line AA' of FIG. 1. The first support post 9 includes a top surface 14, a side surface 15, and a bottom surface 16. The top surface 14 is a surface of the first support post 9 close to the first electrode 5. The bottom surface 16 is a surface of the first support post 9 close to the pixel defining layer 1. The side surface 15 intersects both the top surface 14 and the bottom surface 16. An area of the bottom surface 16 is larger than an area of the top surface 14. Moreover, an angle between the side surface 15 and the top surface 14 is larger than 90°, and the first electrode 5 covers the top surface 14 and the side surface 15. In an embodiment of the present disclosure, by configuring the area of the bottom surface 16 of the first support post 9 to be larger than the area of the top surface 14 thereof, the first support. post 9 can have relatively high stability, so that when the display panel is subjected to an external force, a position of the first support post 9 is less likely to shift, so as to more effectively support the display panel. In addition, by configuring the angle between the side surface 15 and the top surface 14 to be larger than 90°, it can be ensured that a vapor deposition material covers the side surface 15 of the first support post 9 when the first electrode 5 is vapor-deposited on the side of the first support post 9 facing away from the pixel defining layer 1. Moreover, risk of breakage of the first electrode 5 at a position where the top surface 14 and the side surface 15 are connected can also be reduced, thereby improving transmission stability of negative power signals on the first electrode 5.

Figure 6:
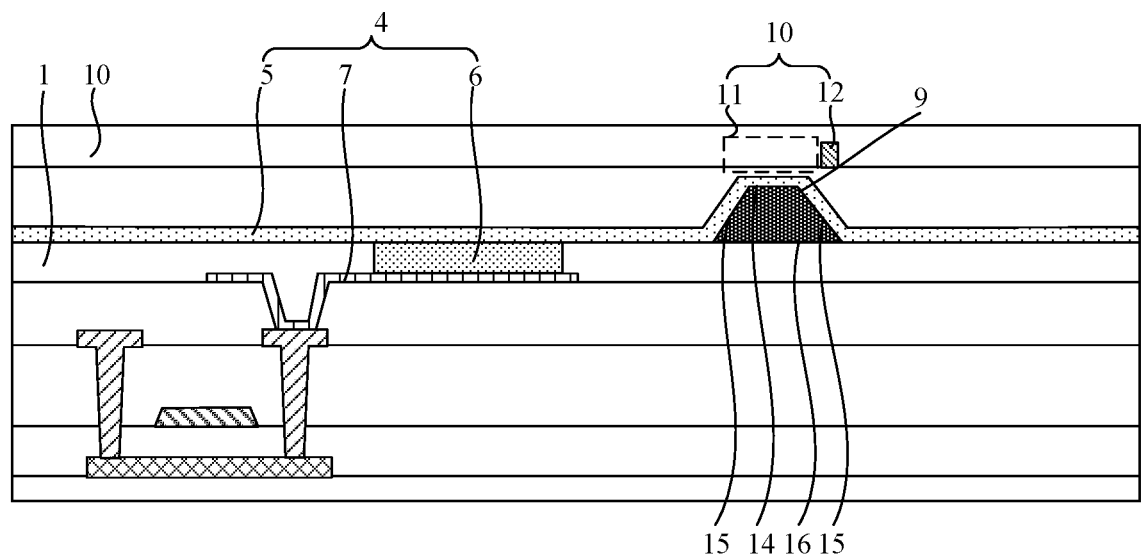
FIG. 6 illustrates another cross-sectional schematic diagram along line AA' of FIG. 1.

FIG. 6 illustrates another representative cross-sectional schematic diagram along AA' of FIG. 1. An orthographic projection of the first portion 12 on the plane where the display panel is located is within an orthographic projection of the side surface 15 on the plane where the display panel is located. For the support post, a distance between the top surface 14 and a plane where the touch layer 10 is located is smaller than a distance between the side surface 15 and the plane where the touch layer 10 is located. Namely, compared to the first electrode 5 covering the top surface 14, a distance between the first electrode 5 covering the side surface 15 and the plane where the touch layer 10 is located is larger. Therefore, in the embodiments of the present disclosure, by configuring the orthographic projection of the first portion 12 of the touch layer 10 on the plane where the display panel is located to be within the orthographic projection of the side surface 15 on the plane where the display panel is located, a distance between the first portion 12 and the first electrode 5 can be increased, thereby reducing the parasitic capacitance formed between the touch layer 10 and the first electrode 5.

Figure 7:
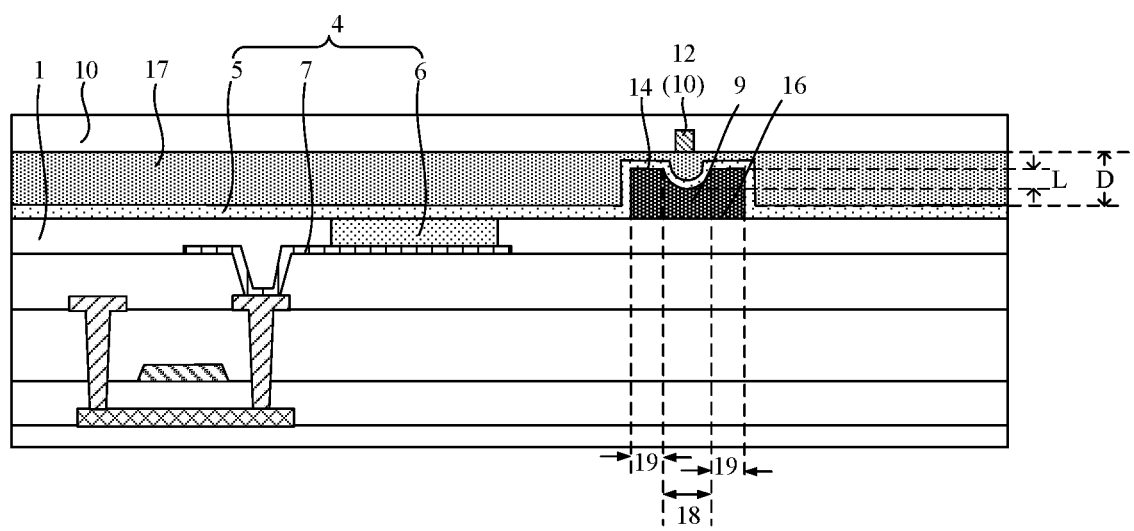
FIG. 7 illustrates another cross-sectional schematic diagram along line AA' of FIG. 1.

FIG. 7 illustrates another representative cross-sectional schematic diagram along AA' of FIG. 1. In order to achieve insulation between the first electrode 5 and the touch layer 10 to avoid signal interference, the display panel further includes an insulating layer 17 located between the first electrode 5 and the touch layer 10, and the insulating layer 17 covers the first electrode 5.

Referring again to FIG. 7, the top surface 14 of the first support post 9 includes a first region 18 and a second region 19. A distance from any position in the first region 18 to the plane where the bottom surface 16 is located is smaller than a distance from any position in the second region 19 to the plane where the bottom surface 16 is located, i.e., the top surface 14 is an uneven concave-convex structure, in which a position where the first region 18 is located into a concave portion and a position where the second region 19 is located is formed into a convex portion.

In the embodiments of the present disclosure, the orthographic projection of the first portion 12 on the plane where the display panel is located is in the orthographic projection of the first region 18 on the plane where the display panel is located. Since a distance from the first region 18 to the plane where the bottom surface 16 is located is relatively small, a distance from the first electrode 5 covering the first region 18 to the plane where the bottom surface 16 is located will be correspondingly reduced. Compared with the case in which the orthographic projection of the first portion 12 on the plane where the display panel is located corresponds to the second region 19 of the top surface 14, in the embodiments of the present disclosure, by configuring the orthographic projection of the first portion 12 of the touch layer 10 on the plane where the display panel is located to be within the orthographic projection of the first region 18 on the plane where the display panel is located, i.e., by configuring the first portion 12 to be corresponding to the concave portion of the top surface 14, a distance between the first portion 12 and the first electrode 5 directly facing thereto is increased, thereby reducing the parasitic capacitance formed between the touch layer 10 and the first electrode 5.

On the other hand, since the top surface 14 of the first support post 9 is a concave-convex structure, when the display panel is subjected to an external force, the convex second region 19, compared to the concave first region 18, is easily squeezed to the insulating layer 17 to puncture the insulating layer 17, which in turn causes the first electrode 5 at the second region 19 to contact the touch layer 10, resulting in a short circuit. Therefore, in the embodiments of the present disclosure, by configuring the first portion 12 of the touch layer 10 to be corresponding to the concave first region 18, the risk of short-circuiting the first portion 12 and the first electrode 5 when the display panel is subjected to an external force is reduced, and thus, the stability and accuracy of signal transmission are improved.

Figure 8:
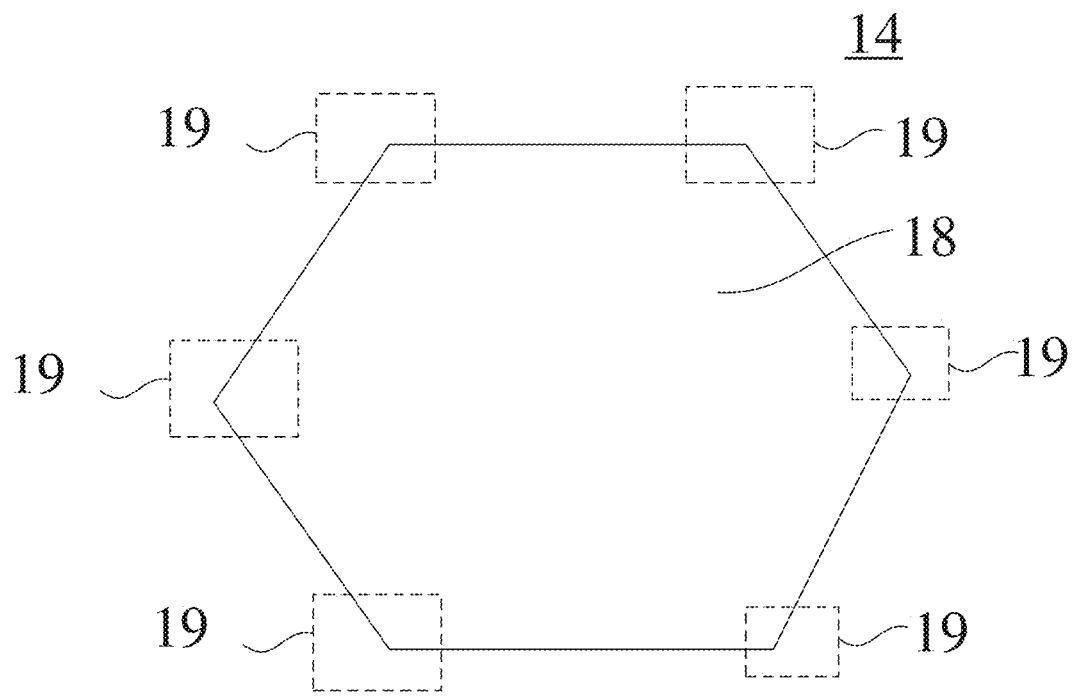
FIG. 8 illustrates a top schematic diagram of a top surface of a first support post.

FIG. 8 illustrates a top schematic diagram of a representative top surface of a first support post. The top surface 14 of the first support post 9 has a shape of a polygon, and a plurality of corners of the polygon are in the second region 19. Moreover, a distance from any position between two adjacent corners to the plane where the bottom surface 16 is located is less than a distance from the corner to the plane where the bottom surface 16 is located. Orthographic projections of the corner and the first portion 12 on the plane where the display panel is located do not overlap. Since the region where the corner is located is provided with no touch layer 10, the first electrode 5 will not be in short-circuit contact with the first portion 12 when the display panel is subjected to an external force, even if the corner of the first support post 9 punctures the insulating layer 17.

Figure 9:
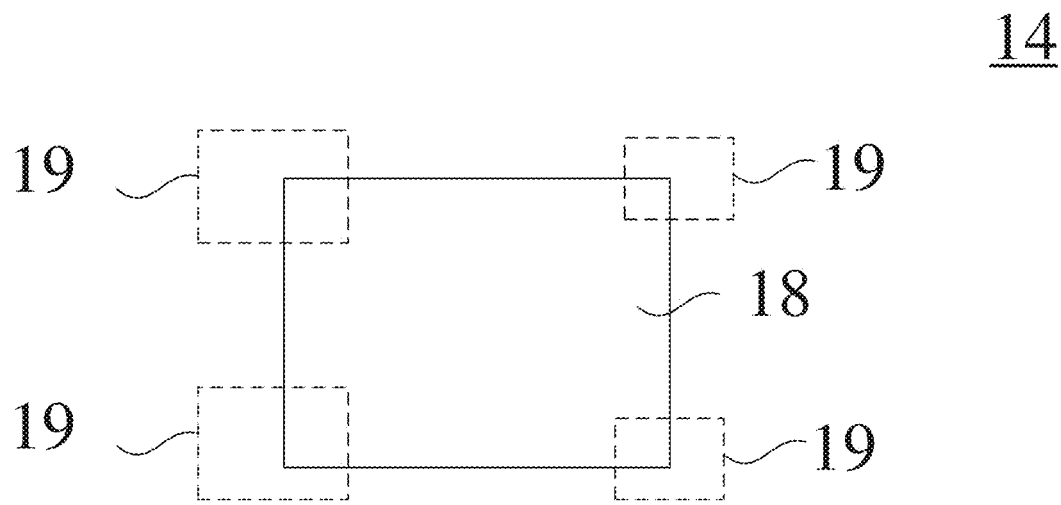
FIG. 9 illustrates a top schematic diagram of a top surface of another first support post.

Further, in order to simplify the structure of the first support post 9 and reduce the manufacturing difficulty, FIG. 9 illustrates a top schematic diagram of a top surface of another first support post. In the embodiments of the present disclosure, the shape of the top surface 14 of the first support post 9 may be a quadrilateral, and four corners of the quadrilateral are located in the second region 19, and regions of the quadrilateral other than the four corners are located in the first region 18.

Optionally, as shown in FIG. 7, wherein the maximum difference L of a distance from any position in the second region 19 and the first region 18 to the plane where the bottom surface 16 is located is smaller than a thickness D of the insulating layer 17, to further avoid the risk of puncturing the insulating layer 17 by the first support post 9, thereby lowering the possibility of short circuit between the first electrode 5 and the touch layer 10.

Figure 10:
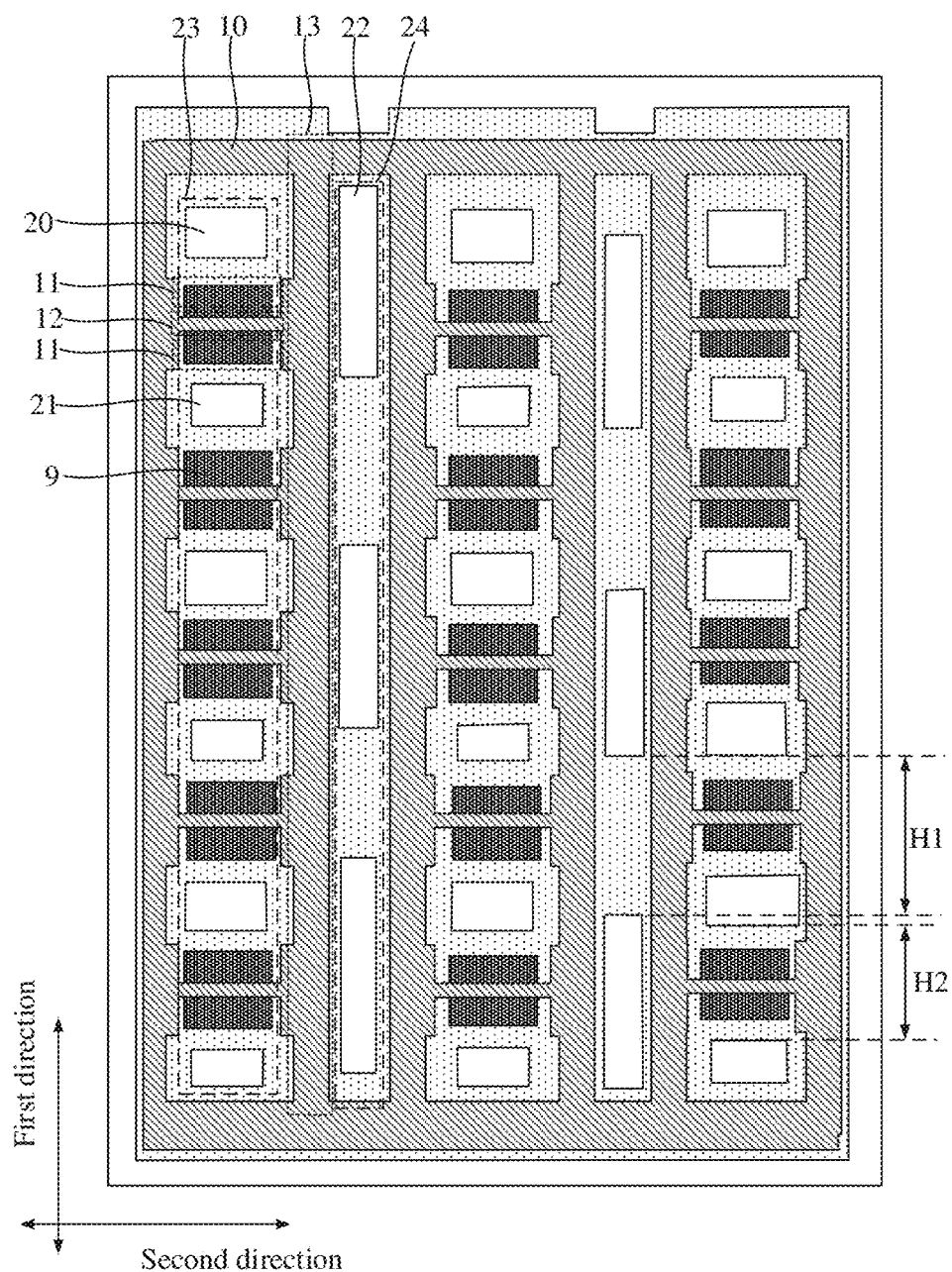
FIG. 10 illustrates a top schematic diagram of still another display panel according to an embodiment of the present disclosure.

FIG. 10 illustrates another representative top diagram of a display panel according to an embodiment of the present disclosure. The light-emitting layer 6 includes first color light-emitting layers 20, second color light-emitting layers 21 and third color light-emitting layers 22. A plurality of first color light-emitting layer 20 and a plurality of second color light-emitting layers 21 are alternately arranged along a first direction to form a first pixel column 23; a plurality of third color light-emitting layers 22 are arranged along the first direction to form a second pixel column 24; the first pixel column 23 and the second pixel column 24 are arranged in a second direction; the first direction intersects with the second direction. A distance H1 between two adjacent third color light-emitting layers 22 is larger than a distance H2 between the first color light-emitting layer 20 and an adjacent second color light-emitting layer 21. The first support post 9 is located between the first color light-emitting layer 20 and the adjacent second color light-emitting layer 21.

Since a spacing between the first color light-emitting layers 20 and the adjacent second color light-emitting layer 21 is relatively small, while considering the alignment accuracy, the minimum wire width of the touch layer, and the performance of the touch layer, a solution in which a touch layer above a support post is completely removed is adopted in the related art. However, in the solution of the related art, it is not possible to provide the support post between two light-emitting layers with a relatively small spacing. Therefore, installation space for the support post is limited, which affects a density of the support post. In contrast, in the embodiments of the present disclosure, by retaining the first portion above the first support post, the first support post 9 can be disposed between two color light-emitting layers with a relatively small spacing, which improves an arrangement density of the first support post 9 in the display panel and thus is beneficial to improvement of a mechanical performance of the display panel.

Figure 11:
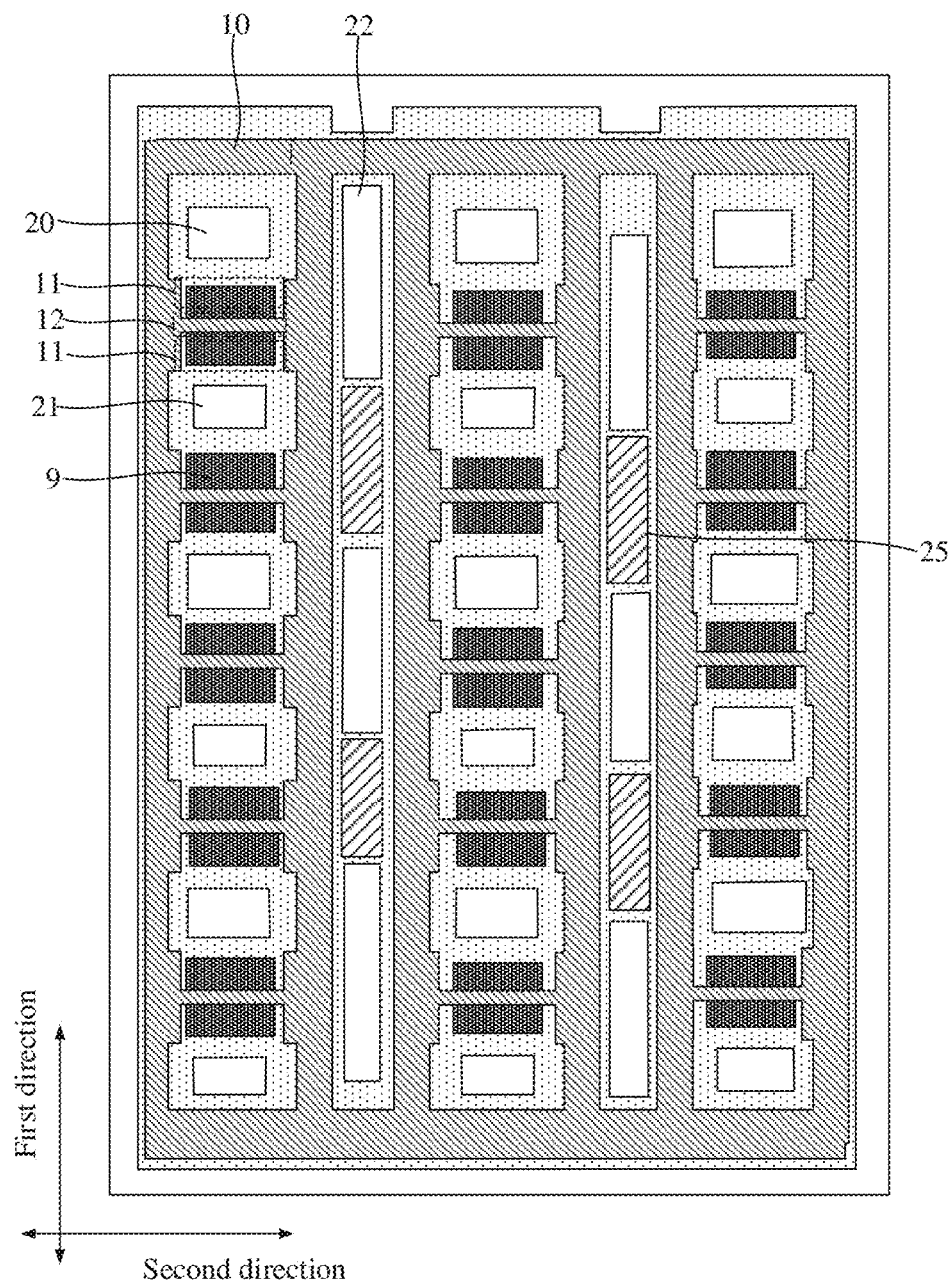
FIG. 11 illustrates a top schematic diagram of still another display panel according to an embodiment of the present disclosure.

FIG. 11 illustrates a representative top schematic diagram of still another display panel according to an embodiment of the present disclosure. In order to further improve the support stability of the display panel, the display panel further includes a second support post 25. The second support post 25 is located between adjacent two third color light-emitting layers 22. The orthographic projections of the touch layer 10 and the second support post 25 on the plane where the display panel is located do not overlap, to reduce the parasitic capacitance formed between the first electrode 5 and the touch layer 10 in the region where the second support post 25 is located.

Further, referring again to FIG. 10, the orthographic projection of the second portion 13 of the touch layer 10 on the plane where the display panel is located is located between the first pixel column :23 and the second pixel column 24, to ensure that the touch layer 10 is disposed correspondingly in most areas of the display region 8, thereby improving the touch accuracy of the display panel.

Optionally, in order to reduce a load resistance of the touch layer 10 and improve a touch sensitivity, a material of the touch layer 10 may be a metal material. Moreover, based on the opaque characteristics of the metal, the orthographic projections of the touch layer 10 and the light-emitting layer 6 on the plane where the display panel is located do not overlap, to prevent the touch layer 10 from blocking the light-emitting layer 6, which otherwise affects normal light-emitting.

Figure 12:
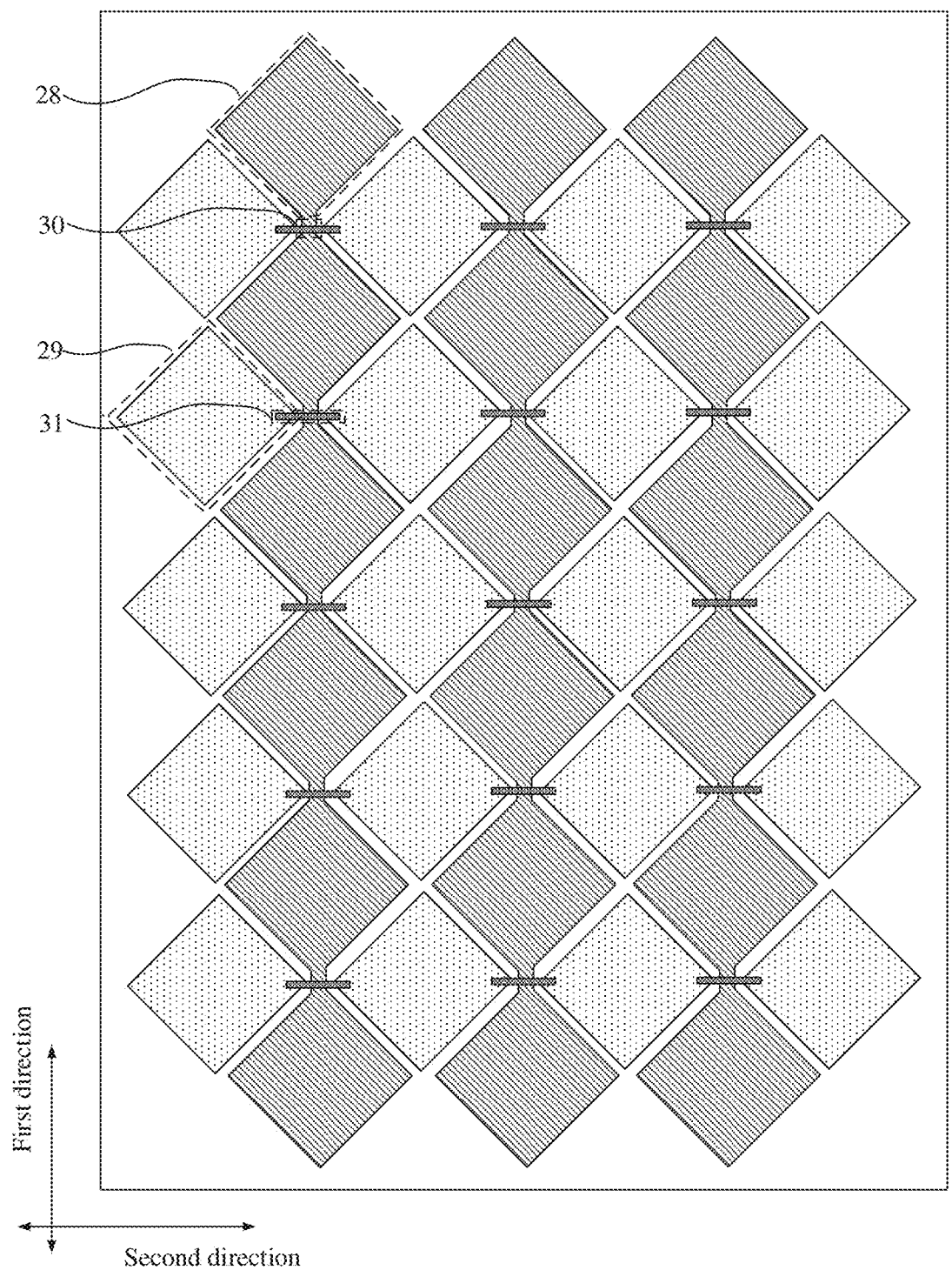
FIG. 12 illustrates a top schematic diagram of still another display panel according to an embodiment of the present disclosure.
Figure 13:
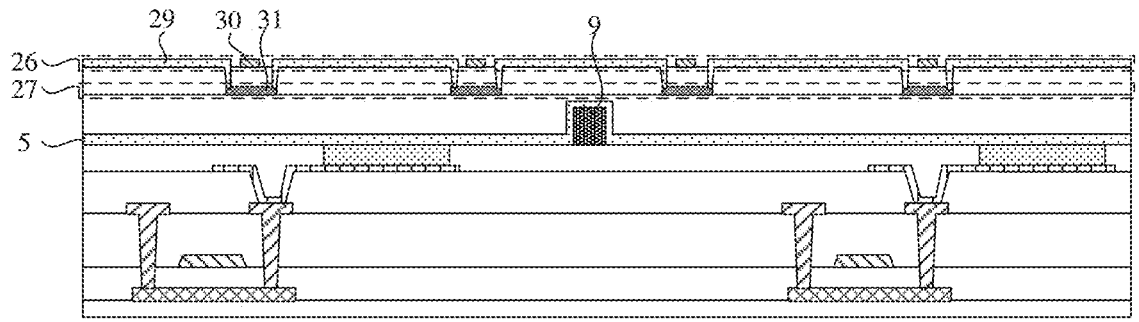
FIG. 13 illustrates a cross-sectional schematic diagram of still another display panel according to an embodiment of the present disclosure.

FIG. 12 illustrates a representative top schematic diagram of still another display panel according to an embodiment of the present disclosure, and FIG. 13 illustrates a representative cross-sectional schematic diagram of still another display panel according to an embodiment of the present disclosure. When the display panel is a mutual-capacitive touch display panel, the touch layer 10 includes a touch electrode layer 26 and a bridge layer 27 that are stacked. The touch electrode layer 26 includes a plurality of first touch electrode blocks 28 and a plurality of second touch electrode blocks 29, and in the first direction, two adjacent first touch electrode blocks 28 are connected through a connecting portion 30. The connecting portion 30 is disposed on the touch electrode layer 26. In the second direction, two adjacent second touch electrode blocks 29 are connected by a bridge 31, and the bridge 31 is disposed on the bridge layer 27. As shown in FIG. 13, the touch electrode layer 26 is disposed at a side of the bridge layer 27 facing away from the first electrode 5.

At this time, the first touch electrode block 28 and the second touch electrode block 29 can be formed using a light-transmitting material such as indium tin oxide, indium zinc oxide or indium gallium zinc oxide.

Compared with the touch electrode layer 26, the bridge layer 27 is provided with the bridge 31, and the bridge 31 has a relatively small area. Therefore, by configuring the bridge layer 27 having a relatively small area to be closer to the first electrode 5, the parasitic capacitance between the first electrode 5 and the touch layer 10 can be reduced to a larger extent.

Figure 14:
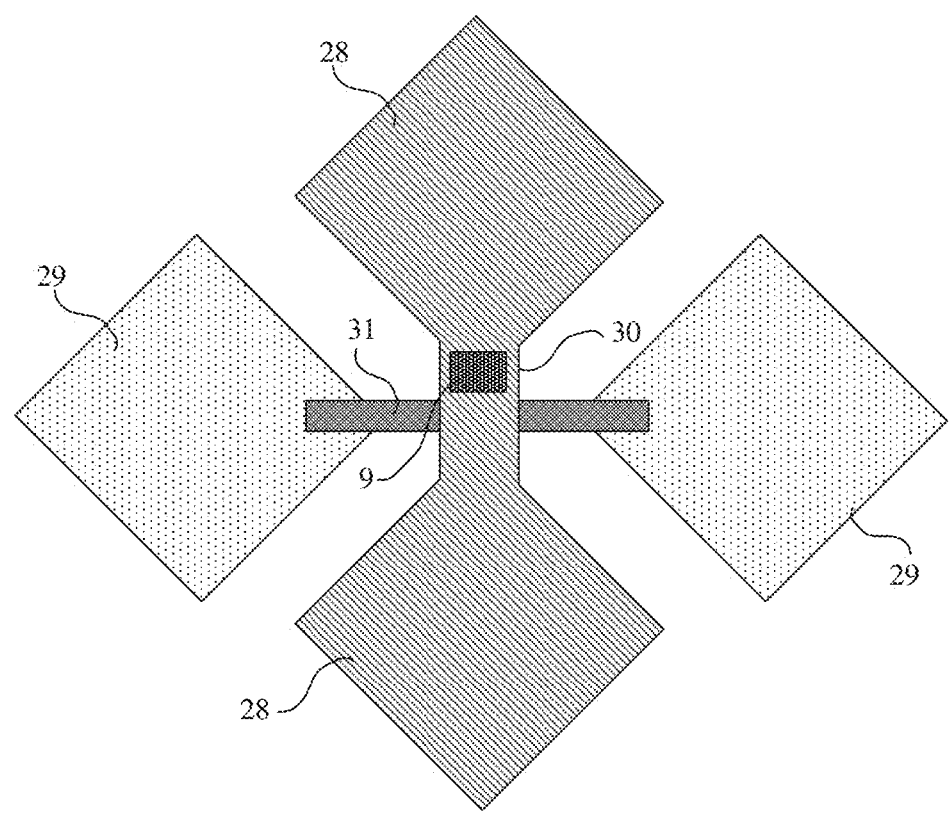
FIG. 14 illustrates a schematic diagram showing a relevant position of a touch layer and a first support post according to an embodiment of the present disclosure.

FIG. 14 illustrates a representative schematic diagram of a relevant position of a touch layer and a first support post according to an embodiment of the present disclosure. in a direction perpendicular to the display panel, the first support post 9 overlaps the connecting portion 30, and the first support post 9 does not overlap the bridge 31. In the embodiments of the present disclosure, by configuring the first support post 9 to overlap the connecting portion 30, a directly facing area between the first electrode 5 covering the first support post 9 and the touch layer 10 can be reduced due to the relatively small area of the connecting portion 30, thereby further reducing the parasitic capacitance between the first electrode 5 and the touch layer 10.

Figure 15:
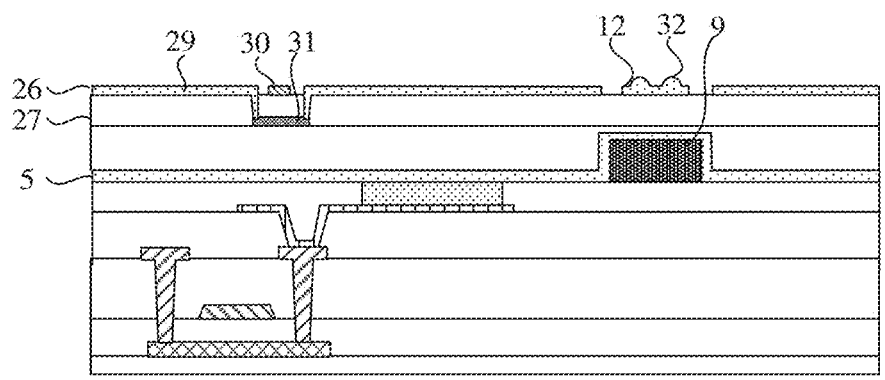
FIG. 15 illustrates a cross-sectional schematic diagram of still another display panel according to an embodiment of the present disclosure.

FIG. 15 illustrates a representative cross-sectional diagram of still another display panel according to an embodiment of the present disclosure. In a direction perpendicular to the display panel, the first support post 9 does not overlap the connecting portion 30, and the first support post 9 overlaps the first touch electrode block 28 or the second touch electrode block 29 to form the first portion 12. The first portion 12 of the touch layer 10 includes a plurality of convex portions 32 that protrude towards a side facing away from the first electrode 5. After the convex portion 32 protrudes, the distance between the touch layer 10 and the first electrode 5 is increased, so that the parasitic capacitance formed between the two can be reduced.

Figure 16:
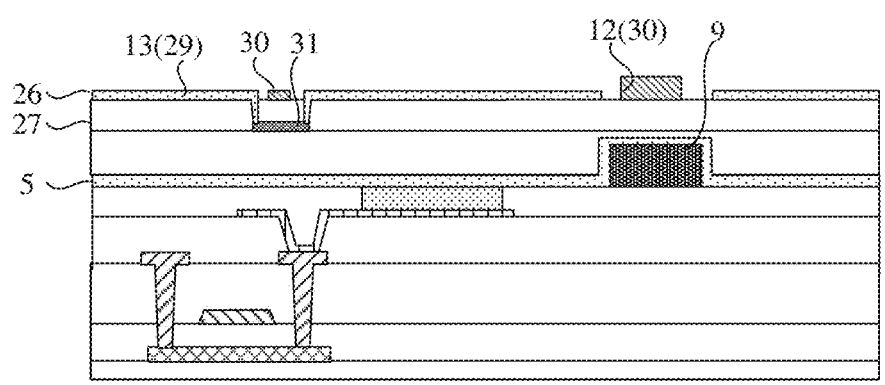
FIG. 16 illustrates a cross-sectional schematic diagram of still another display panel according to an embodiment of the present disclosure.

Optionally, the first portion 12 may include an overlapping region of the connecting portion 30 and the first supporting post 9, or the first portion 12 includes an overlapping region of the first touch electrode block 28 and the first support post 9, or the first portion 12 includes an overlapping region of the second touch electrode block 29 and the first support post 9. FIG. 16 illustrates a representative cross-sectional schematic diagram of still another display panel according to an embodiment of the present disclosure. Taking a case where the first portion 12 includes an overlapping region of the connecting portion 30 and the first support post 9 as an example, a thickness of the first portion 12 is larger than a thickness of the second portion 13 in the direction perpendicular to the display panel, thereby increasing the distance between the first portion 12 and the first electrode 5 covering the first support post 9 and thereby reducing the parasitic capacitance formed between the first electrode 5 and the touch layer 10.

Figure 17:
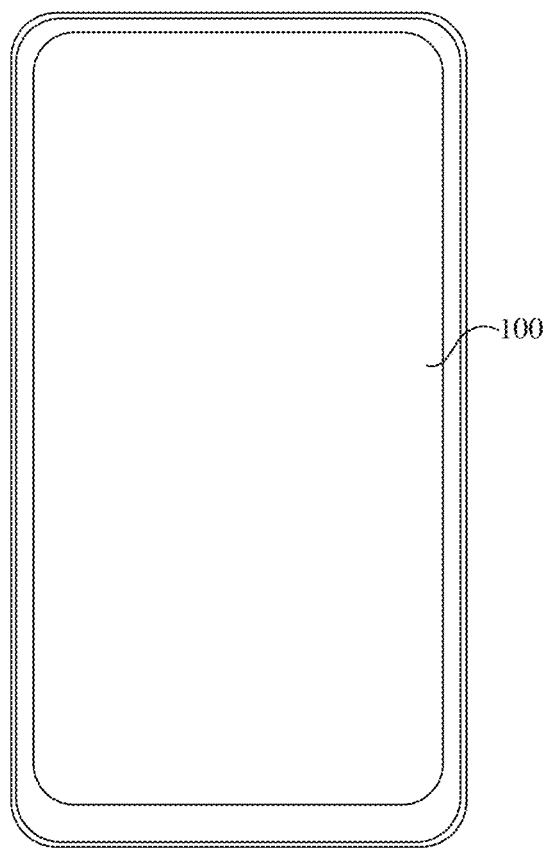
FIG. 17 illustrates a structural schematic diagram of a display device according to an embodiment of the present disclosure.

An embodiment of the present disclosure further provides a display device. FIG. 17 illustrates a structural schematic diagram of a display device according to an embodiment of the present disclosure, and the display device includes the above display panel 100. The specific structure of the display panel 100 has been described in detail in the above embodiments, and details are not described herein again. It is appreciated that, the display device shown in FIG. 17 is representative, and the display device may he any electronic device having a display function such as a mobile phone, a tablet computer, a laptop computer, an e-book, or a television set.

Since the display device provided by the embodiment of the present disclosure includes the above display panel 100, adopting the display device can also improve the touch precision and mechanical strength of the display device under the premise that the parasitic capacitance formed between the touch layer 10 and the first electrode 5 is reduced.

The above are representative embodiments of the present disclosure and are not intended to limit the present disclosure. Any modifications, equivalents, improvements, etc., which are made within the spirit and principles of the present disclosure, should be included in the scope of the present disclosure.

What is claimed is:
1. A display panel, comprising:
  a pixel defining layer comprising a plurality of aperture regions and a non-aperture region;
  a light-emitting unit comprising a first electrode, a light-emitting layer, and a second electrode that are stacked, wherein the light-emitting layer is arranged in the aperture region, the first electrode is located at a side of the light-emitting layer facing away from the pixel defining layer, the second electrode is located at a side of the light-emitting layer close to the pixel defining layer, and the first electrode covers a display region over its entire surface;

a first support post located between the pixel defining layer and the first electrode in a direction perpendicular to a plane of the display panel, wherein an orthographic projection of the first support post on the plane of the display panel is within the non-aperture region, and the first electrode completely covers the light-emitting layer and the first support post; and a touch layer located at a side of the first electrode facing away from the pixel defining layer, and comprising a hollow portion, a first portion and a second portion connected to the first portion, wherein both the first portion and the hollow portion overlap the first support post in a direction perpendicular to the plane of the display panel, the second portion does not overlap the first support post in the direction perpendicular to the plane of the display panel, and an area of an overlapping portion of the first portion and the first support post is smaller than an area of the first support post in the direction perpendicular to the plane of the display panel.

2. The display panel according to claim 1, wherein, the first support post comprises a top surface, a side surface and a bottom surface, the top surface is a surface of the first support post close to the first electrode, the bottom surface is a surface of the first support post close to the pixel defining layer, the side surface intersects with both the top surface and the bottom surface, an area of the bottom surface is larger than an area of the top surface, an angle between the side surface and the top surface is larger than 90°, and the first electrode covers the top surface and the side surface.

3. The display panel according to claim 2, wherein, an orthographic projection of the first portion on the plane of the display panel is within an orthographic projection of the side surface on the plane of the display panel.

4. The display panel according to claim 2, further comprising:
an insulating layer located between the first electrode and the touch layer, the insulating layer covering the first electrode.

5. The display panel according to claim 4, the top surface of the first support post comprises a first region and a second region, a distance from any position in the first region to a plane of the bottom surface is smaller than a distance from any position e second region to the plane of the bottom surface, and the orthographic projection of the first portion on the plane of the display panel is within an orthographic projection of the first region on the plane of the display panel.

6. The display panel according to claim 5, wherein the top surface has a shape of a polygon comprising a plurality of corners located in the second region, a distance from any position between adjacent two corners of the plurality of corners to the plane of the bottom surface is smaller than a distance from any one of the adjacent two corners to the plan of the bottom surface, and orthographic projections of any of the plurality of corners and the orthographic projection of the first portion on the plane of the display panel do not overlap.

7. The display panel according to claim 6, wherein, the top surface has a shape of a quadrilateral comprising four corners located in the second region, and regions of the quadrilateral other than the four corners are located in the first region.

8. The display panel according to claim 5, wherein, a maximum difference between a distance from any position in the second region to the plane of the bottom surface and a distance from any position in the first region to the plane of the bottom surface is smaller than a thickness of the insulating layer.

9. The display panel according to claim 1, wherein, the light-emitting layer comprises a plurality of first color light-emitting layers, a plurality of second color light-emitting layers and a plurality of third color light-emitting layers;

the plurality of first color light-emitting layers and the plurality of second color light-emitting layers are alternately arranged along a first direction to form a first pixel column;

the plurality of third color light-emitting layers is arranged along the first direction to form a second pixel column;

the first pixel column and the second pixel column are arranged in a second direction, and the first direction intersects with the second direction; and a distance between adjacent two of the plurality of third color light-emitting layers is larger than a distance between one of the plurality of first color light-emitting layers and one of the plurality of second color light-emitting layers adjacent thereto, and the first support post is located between one of the plurality of first color light-emitting layers and one of the plurality of second color light-emitting layers adjacent thereto.

10. The display panel according to claim 9, further comprising:
a second support post located, in the first direction, between adjacent two of the plurality of third color light-emitting layers, and an orthographic projection of the touch layer on the plane of the display panel does not overlap an orthographic projection of the second support post on the plane of the display panel.

11. The display panel according to claim 9, wherein, the orthographic projection of the second portion on the plane of the display panel is located between the first pixel column and the second pixel column.

12. The display panel according to claim 1, wherein, the touch layer is made of a metal material, and an orthographic projection of the touch layer on the plane of the display panel does not overlap an orthographic projection of the light-emitting layer on the plane of the display panel.

13. The display panel according to claim 1, wherein, the touch layer comprises a touch electrode layer and a bridge layer that are stacked;

the touch electrode layer comprises a plurality of first touch electrode blocks and a plurality of second touch electrode blocks, in the first direction, adjacent two of the plurality of first touch electrode blocks are connected through a connecting portion, and the connecting portion is disposed on the touch electrode layer;

in the second direction, adjacent two of the plurality of second touch electrode blocks are connected by a bridge, and the bridge is disposed on the bridge layer; and the touch electrode layer is disposed at a side of the bridge layer facing away from the first electrode.

14. The display panel according to claim 13, wherein,
in a direction perpendicular to the display panel, the first support post overlaps the connecting portion and does not overlap the bridge.

15. The display panel according to claim 13, wherein,
in a direction perpendicular to the display panel, the first support post does not overlap the connecting portion, and the first support post overlaps the plurality of first touch electrode blocks or the plurality of second touch electrode blocks to form the first portion located in the touch layer; and
the first portion comprises a plurality of convex portions, the plurality of convex portions protruding towards a direction facing away from the first electrode.

16. The display panel according to claim 14, wherein,
the first portion comprises an overlapping region of the connecting portion or one or more of the plurality of first touch electrode blocks or one or more of the plurality of second touch electrode blocks with the first support post; and
in the direction perpendicular to the display panel, a thickness of the first portion is larger than a thickness of the second portion.

17. The display panel according to claim 15, wherein,
the first portion comprises an overlapping region of the connecting portion or one or more of the plurality of first touch electrode blocks or one or more of the plurality of second touch electrode blocks with the first support post; and
in the direction perpendicular to the display panel, a thickness of the first portion is larger than a thickness of the second portion.

18. A display device, comprising a display panel, wherein the display panel comprises:

a pixel defining layer comprising a plurality of aperture regions and a non-aperture region;

a light-emitting unit comprising a first electrode, a light-emitting layer, and a second electrode that are stacked, wherein the light-emitting layer is arranged in the aperture region, the first electrode is located at a side of the light-emitting layer facing away from the pixel defining layer, the second electrode is located at a side of the light-emitting layer close to the pixel defining layer, and the first electrode covers a display region over its entire surface;

a first support post located between the pixel defining layer and the first electrode in a direction perpendicular to a plane of the display panel, wherein an orthographic projection of the first support post on the plane of the display panel is within the non-aperture region, and the first electrode completely covers the light-emitting layer and the first support post; and a touch layer located at a side of the first electrode facing away from the pixel defining layer, and comprising a hollow portion, a first portion and a second portion connected to the first portion, wherein both the first portion and the hollow portion overlap the first support post in a direction perpendicular to the plane of the display panel, the second portion does not overlap the first support post in the direction perpendicular to the plane of the display panel, and an area of an overlapping portion of the first portion and the first support post is smaller than an area of the first support post in the direction perpendicular to the plane of the display panel.

* * * * *

UNITED STATES PATENT AND TRADEMARK OFFICE
CERTIFICATE OF CORRECTION

PATENT NO. : 10,892,306 B1  
APPLICATION NO. : 16/681962  
DATED : January 12, 2021  
INVENTOR(S) : Y. Fang et al.

Page 1 of 1

It is certified that error appears in the above-identified patent and that said Letters Patent is hereby corrected as shown below:

In the Claims

| Column | Line | Claim | |
|--------|------|-------|---|
| 9 | 52 | 5 | Delete "e second" and insert --in the second-- |

Signed and Sealed this  
Eighth Day of June, 2021

Drew Hirshfeld  
*Performing the Functions and Duties of the*  
*Under Secretary of Commerce for Intellectual Property and*  
*Director of the United States Patent and Trademark Office*